United States Patent
Nallan et al.

(10) Patent No.: US 6,415,198 B1
(45) Date of Patent: Jul. 2, 2002

(54) PLASMA ETCHING OF SILICON USING A CHLORINE CHEMISTRY AUGMENTED WITH SULFUR DIOXIDE

(75) Inventors: Padmapani C. Nallan; Ajay Kumar, both of Sunnyvale; Jeffrey D. Chinn, Foster City, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/344,878

(22) Filed: Jun. 25, 1999

(51) Int. Cl.[7] .................. G06F 19/00; H01L 21/302
(52) U.S. Cl. .............. 700/121; 438/710; 438/711; 438/719; 216/67; 216/68; 216/79
(58) Field of Search ...................... 700/121; 438/9, 438/689, 706, 707, 710, 711, 719; 216/63, 67, 68, 79

(56) References Cited

U.S. PATENT DOCUMENTS

| | | | | |
|---|---|---|---|---|
| 5,601,948 A | * | 2/1997 | Binder et al. | 429/218 |
| 5,725,996 A | * | 3/1998 | Houlihan et al. | 430/322 |
| 5,943,283 A | | 8/1999 | Wong et al. | 365/230.01 |
| 6,106,659 A | * | 8/2000 | Spence et al. | 156/345 |
| 6,127,273 A | | 10/2000 | Laermer et al. | 438/709 |
| 6,149,828 A | | 11/2000 | Vaartstra | 216/57 |
| 6,159,811 A | | 12/2000 | Shin et al. | 438/303 |
| 6,235,214 B1 | | 5/2001 | Deshmukh et al. | 216/67 |
| 6,259,105 B1 | | 7/2001 | Eddy et al. | 250/492.21 |
| 6,312,616 B1 | | 11/2001 | Chinn et al. | 216/68 |

* cited by examiner

Primary Examiner—Paul P. Gordon
(74) Attorney, Agent, or Firm—Moser, Patterson & Sheridan; Joseph Bach

(57) ABSTRACT

A method of etching silicon using a chlorine and sulfur dioxide gas chemistry. An embodiment of the method is accomplished using a 20 to 300 sccm of chlorine and 2 to 100 sccm of sulfur dioxide, regulated to a total chamber pressure of 2–100 mTorr.

23 Claims, 5 Drawing Sheets

| PROCESS OF THE PRESENT INVENTION UTILIZING A DSP CHAMBER | | | | |
|---|---|---|---|---|
| PARAMETER | UNITS | RANGE | | PREFERABLY |
| | | MIN | MAX | |
| Cl$_2$ | SCCM | 20 | 300 | 90 |
| SO$_2$ | SCCM | 2 | 100 | 15 |
| TOTAL PRESSURE | mTORR | 2 | 100 | 40 |
| ANTENNA POWER | WATTS | 200 | 2500 | 1000 |
| CATHODE POWER | WATTS | 20 | 300 | 225 |
| PEDESTAL TEMPERATURE | DEGREES CELSIUS | -50 | 100 | 50 |

PLASMA ETCHING OF SILICON USING A CHLORINE CHEMISTRY AUGMENTED WITH SULFUR DIOXIDE

BACKGROUND OF THE DISCLOSURE

1. Field of Invention

The present invention relates generally to a method of dry etching semiconductor wafers. More specifically, the invention relates to a method of etching silicon using a gas mixture comprising chlorine with sulfur dioxide.

2. Description of the Background Art

During state-of-the-art semiconductor processing of semiconductor devices, many devices are made in a single substrate, such as a silicon wafer. These devices are connected to each other by means of conductive lines. However, since these conductive lines can introduce unwanted electrical signals in the semiconductor substrate during operation of these devices, the devices are separated from each other by some means of isolation. The usual means of isolation is to etch trenches in the substrate between the devices that can be filled with a dielectric material, such as silicon dioxide.

Such trenches, since they are later filled with a dielectric material, should have sidewalls that are straight and smooth to avoid the formation of voids after filling. The bottom of the trench should have a smooth rounded corner between the sidewall and the bottom as well. Further, it is desirable to be able to etch the trench at a reasonably high etch rate.

Traditionally, trenches are formed in silicon using an anisotropic chemical or reactive ion etch process upon a masked silicon substrate. Chemistries for etching silicon typically utilize combinations of such chemicals as hydrogen bromide (HBr), chlorine ($Cl_2$), oxygen ($O_2$), nitrogen fluoride ($NF_3$), sulfur hexafluoride ($SF_6$), and nitrogen ($N_2$).

For example, using a $Cl_2$ only chemistry can provide a silicon etch rate of about 2853 A/min with a photoresist selectivity (defined as the ratio of the etch rate of silicon to that of the photoresist, or mask, material) of 0.95. A selectivity of less than 1.0 is considered very poor.

Selectivity is one of the limiting criteria when attempting to obtain accurate pattern transfer and small feature sizes on a semiconductor substrate. Generally, higher selectivity allows for smaller feature sizes. To improve wafer processing rates, it is desirable to maximize the silicon etch rate, especially for applications such as trench etching. In general, however, an increase in the silicon etch rate decreases the photoresist etch selectivity.

One method known in the art to improve etch characteristics when using a $Cl_2$ chemistry is to add $O_2$. Such a $Cl_2/O_2$ chemistry provides a silicon etch rate of about 3852 A/min with a photoresist selectivity of 1.5. Although the addition of $O_2$ to the $Cl_2$ chemistry yields an increased etch rate and higher selectivity as compared to that of the $Cl_2$ only chemistry, the overall selectivity to the photoresist still remains relatively low.

Therefore, there is a need in the art for a silicon etching process having an increased silicon etch rate while enhancing mask selectivity.

SUMMARY OF INVENTION

The disadvantages associated with the prior art are overcome by the present invention for etching silicon using a gas mixture comprising gases containing chlorine and sulfur dioxide. In one preferred embodiment, an etch gas (or mixture) comprising chlorine ($Cl_2$) and sulfur dioxide ($SO_2$), is used for etching a silicon substrate at gas flow rates of about 90 sccm $Cl_2$ and about 15 sccm $SO_2$, at a total chamber pressure of about 40 mTorr.

A decoupled plasma source etch reactor is illustratively used to practice one embodiment of the present invention. In general, the reactor uses an inductive source power of about 200–2500 W for plasma generation, and applies a cathode bias power of about 200–300 W to a wafer support pedestal. The reactor maintains the pedestal within a temperature range of about −50 to 100 degrees Celsius. The invention can be practiced, for example, by supplying to the reactor a combination of about 20–300 sccm of chlorine gas and about 2–100 sccm of sulfur dioxide gas, while maintaining a total chamber pressure of about 2–100 mTorr. The gas mixture is supplied to the reaction chamber wherein a plasma is formed and a silicon layer is etched.

BRIEF DESCRIPTION OF DRAWINGS

The teachings of the present invention can be readily understood by considering the following detailed description in conjunction with the accompanying drawings, in which.

To facilitate understanding, identical reference numerals have been used, where possible, to designate identical element that are common to the figures.

DETAIL DESCRIPTION OF INVENTION

The present invention is a method of silicon etching using a plasma generated from a gas (or gas mixture) comprising gases containing chlorine ($Cl_2$, HCl and the like) and sulfur dioxide ($SO_2$). The etch process of the present invention can be reduced to practice in a Silicon Decoupled Plasma Source (DPS) Centura® etch system available from Applied Materials, Inc. of Santa Clara, Calif.

Figure 1:
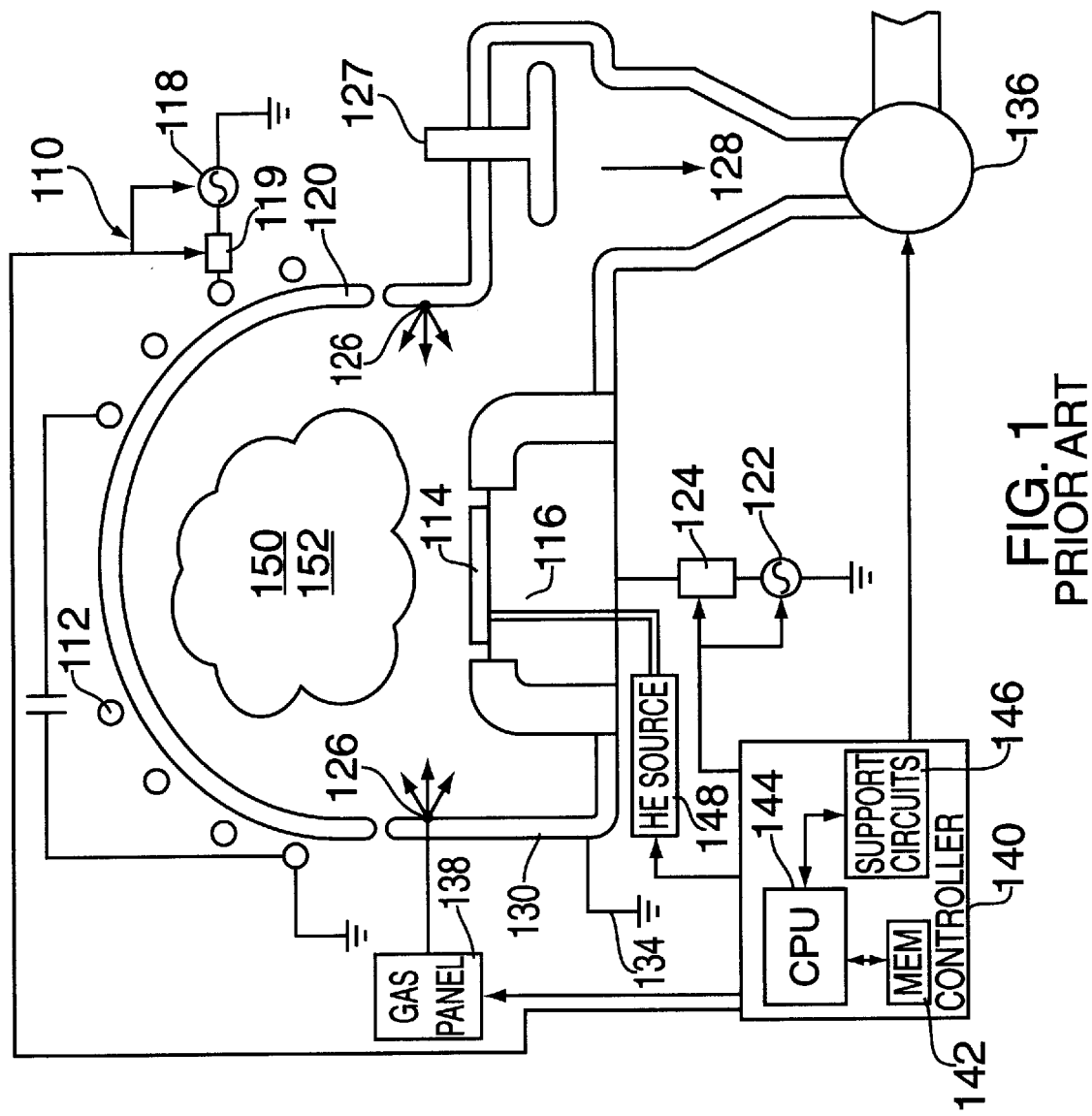
FIG. 1 depicts a schematic diagram of a plasma processing apparatus of the kind used in performing the etching processes of the present invention.

FIG. 1 depicts a schematic diagram of the DPS etch process chamber 110, that comprises at least one inductive coil antenna segment 112, positioned exterior to a dielectric, dome-shaped ceiling 120 (referred to herein as the dome 120). The antenna segment 112 is coupled to a radio-frequency (RF) source 118 (that is generally capable of producing an RF signal having a tunable frequency of about 12.56 MHz). The RF source 118 is coupled to the antenna 112 through a matching network 119. Process chamber 110 also includes a substrate support pedestal (cathode) 116 that is coupled to a second RF source 122 that is generally capable of producing an RF signal having a frequency of approximately 13.56 MHz. The source 122 is coupled to the cathode 116 through a matching network 124. The chamber 110 also contains a conductive chamber wall 130 that is connected to an electrical ground 134. A controller 140 comprising a central processing unit (CPU) 144, a memory 142, and support circuits 146 for the CPU 144 is coupled to the various components of the DPS etch process chamber 110 to facilitate control of the etch process.

In operation, the semiconductor substrate 114 is placed on the substrate support pedestal 116 and gaseous components are supplied from a gas panel 138 to the process chamber 110 through entry ports 126 to form a gaseous mixture 150. The gaseous mixture 150 is ignited into a plasma 152 in the process chamber 110 by applying RF power from the RF sources 118 and 122 respectively to the antenna 112 and the cathode 116. The pressure within the interior of the etch chamber 110 is controlled using a throttle valve 127 situated between the chamber 110 and a vacuum pump 136. The temperature at the surface of the chamber walls 130 is controlled using liquid-containing conduits (not shown) that are located in the walls 130 of the chamber 110.

The temperature of the substrate 114 is controlled by stabilizing the temperature of the support pedestal 116 and flowing helium gas from source 148 to channels formed by the back of the substrate 114 and grooves (not shown) on the pedestal surface. The helium gas is used to facilitate heat transfer between the substrate 114 and the pedestal 116. During the etch process, the substrate 114 is gradually heated by the plasma 150 to a steady state temperature. Using thermal control of both the dome 120 and the pedestal 116, the substrate 114 is maintained at a temperature of −50 to 100 degrees Celsius.

The RF power applied to the inductive coil antenna 112 has a frequency between 50 kHz and 13.56 MHz and has a power of 200 to 2500 Watts. The bias power applied to the pedestal 116 may be DC or RF and is between 20 and 300 Watts.

To facilitate control of the chamber as described above, the CPU 144 may be one of any form of general purpose computer processor that can be used in an industrial setting for controlling various chambers and subprocessors. The memory 142 is coupled to the CPU 144. The memory 142, or computer-readable medium, may be one or more of readily available memory such as random access memory (RAM), read only memory (ROM), floppy disk, hard disk, or any other form of digital storage, local or remote. The support circuits 146 are coupled to the CPU 144 for supporting the processor in a conventional manner. These circuits include cache, power supplies, clock circuits, input/output circuitry and subsystems, and the like. An etching process 200 is generally stored in the memory 142, typically as a software routine 202. The software routine 202 may also be stored and/or executed by a second CPU (not shown) that is remotely located from the hardware being controlled by the CPU 144.

Figure 2:
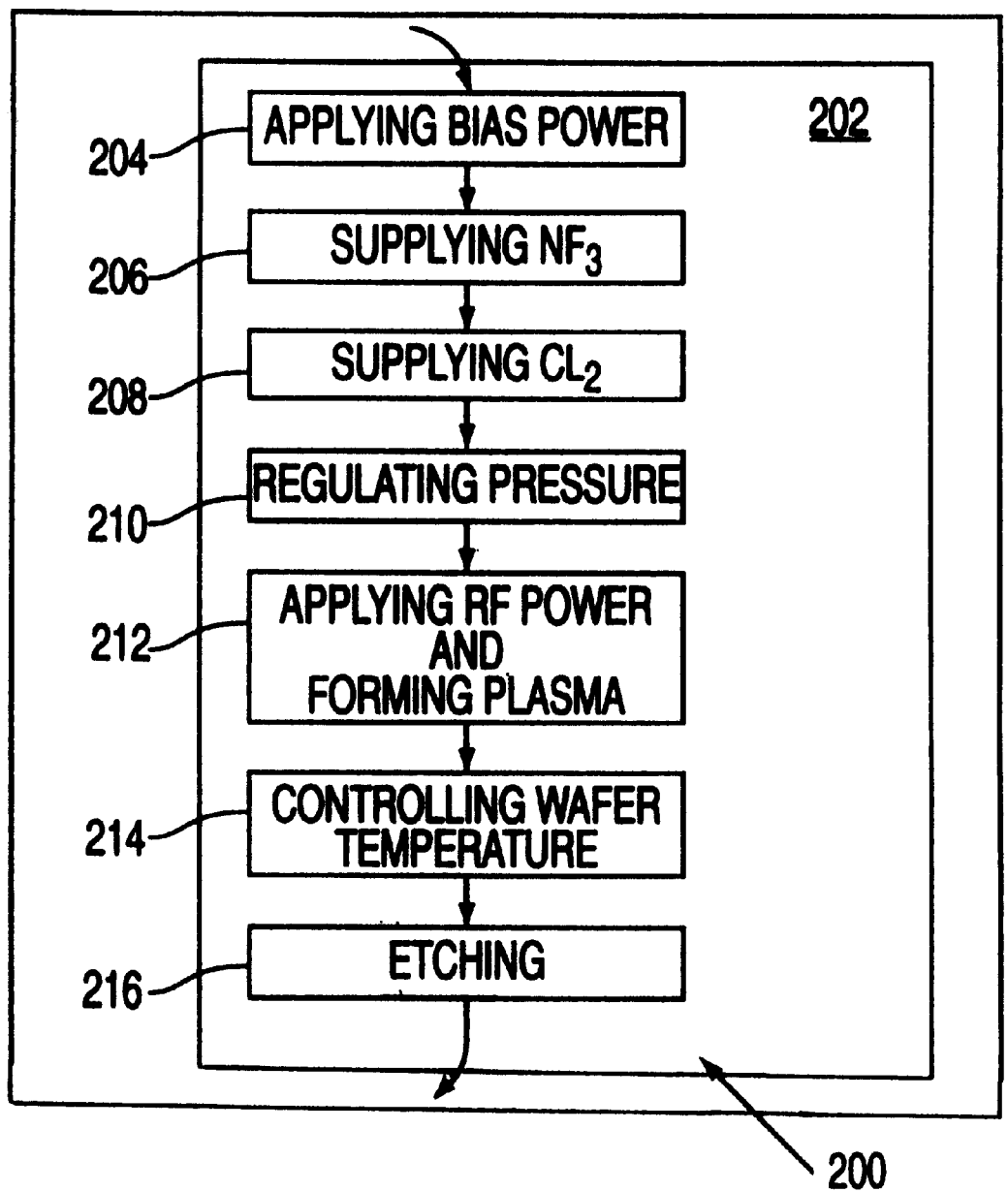
FIG. 2 depicts a flow diagram of the inventive process.

The etching process 200 depicted in FIG. 2 comprises the steps of applying bias power to the pedestal (step 204), supplying gas containing chlorine (i.e., $Cl_2$) to the chamber 100 (step 206), supplying $SO_2$ to the chamber 100 (step 208), regulating the pressure of the $Cl_2$ and $SO_2$ (step 210), applying RF power and forming a plasma (step 212), controlling the wafer temperature (step 214), and etching the silicon (step 216). The etching step 216 is a timed step with the duration of the etch dependant on the depth of etch desired. The etch time is calculated using an etch rate discussed below.

The software routine 202 is discussed with respect to FIG. 1 and FIG. 2. The software routine 202 is executed after a wafer 114 is positioned on the pedestal 116. The software routine 202 when executed by the CPU 144, transforms the general purpose computer into a specific purpose computer (controller) 140 that controls the chamber operation such that the etching process 200 is performed. Although the process of the present invention is discussed as being implemented as a software routine, some of the method steps that are disclosed therein may be performed in hardware as well as by the software controller. As such, the invention may be implemented in software as executed upon a computer system, in hardware as an application specific integrated circuit or other type of hardware implementation, or a combination of software and hardware.

Continuing to refer to FIG. 1 and FIG. 2, the wafer 114 is etched, for example, by first applying a bias power of 225 Watts the pedestal 116 in step 204. The gaseous mixture 150 is supplied to the chamber 110 at a rate of 90 sccm $Cl_2$ and 15 sccm S02 in steps 206 and 208, respectively. In step 210, the total pressure of the gas mixture 150 is regulated to maintain 40 mTorr.

Once the gas mixture 150 is present above the wafer 114, step 212 applies 1000 Watts of RF power to the antenna 112, and plasma 152 is formed. The wafer 114 is cooled to 50 degrees Celsius in step 214 to counteract the heating of the wafer 114 by the plasma 152. Etching of the wafer 114 occurs in step 216.

Figure 4:
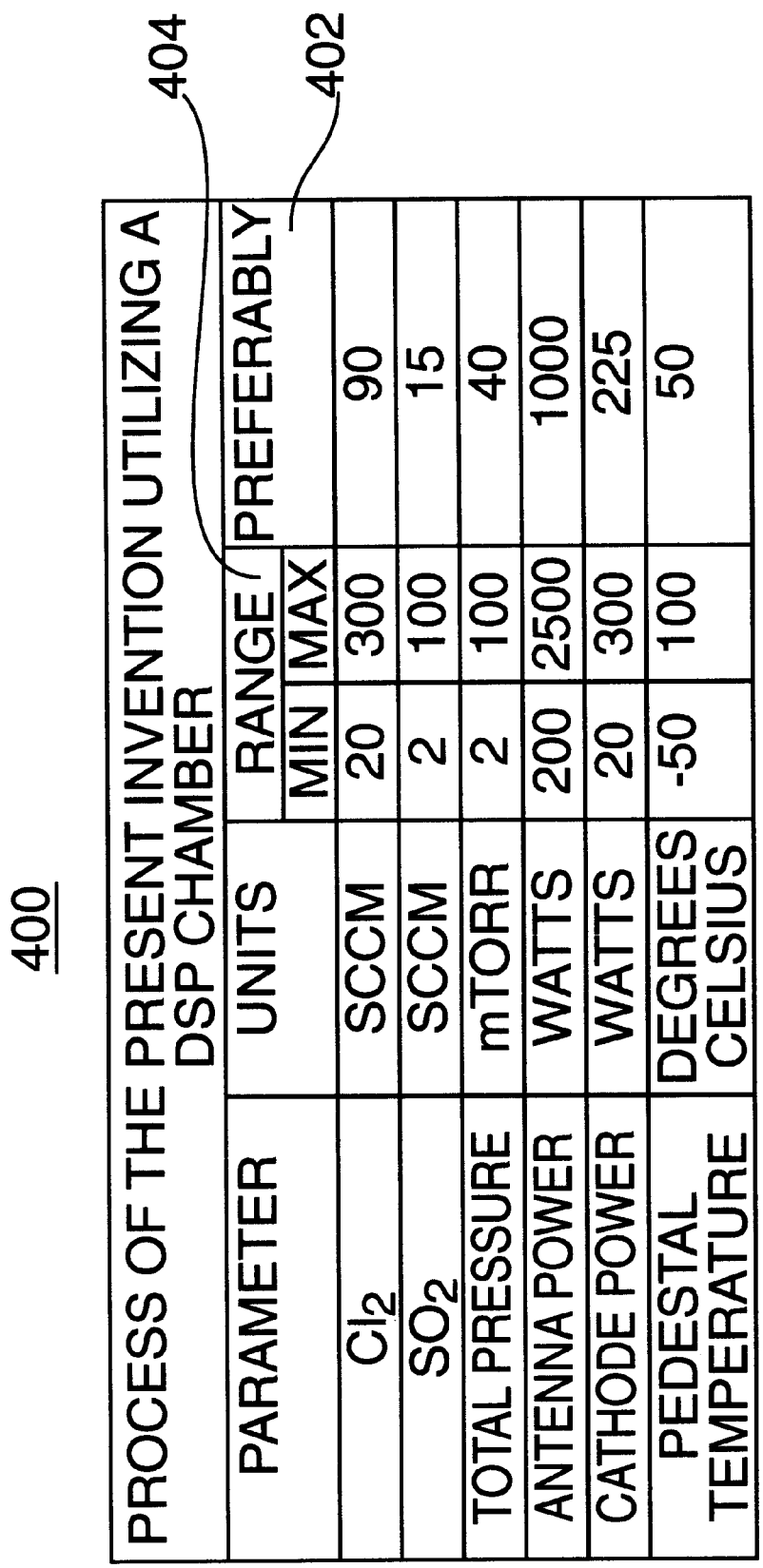
FIG. 4 is a table summarizing the processing parameters of the inventive method when practiced using the apparatus of FIG. 1.

FIG. 4 presents a table 400 summarizing the etch process parameters through which one can practice the invention using a Silicon DPS Centura® system. The etch process parameters for the embodiment of the invention presented above are summarized in column 402. The process ranges are presented in column 404.

Figure 3A:
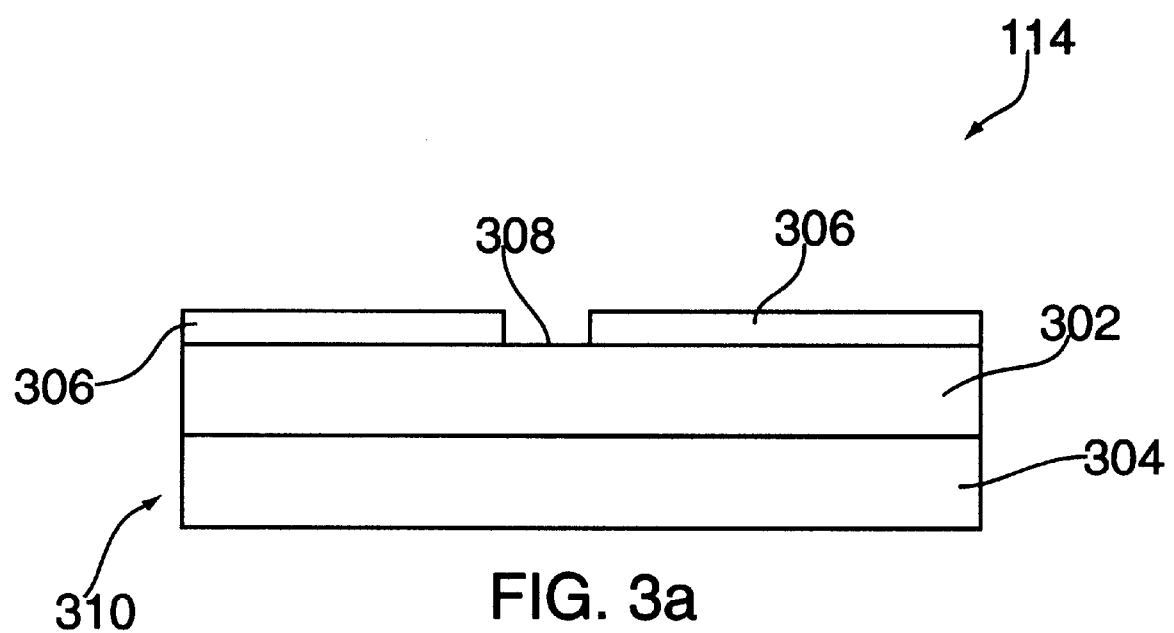
FIG. 3a depicts a schematic elevation of a wafer having a silicon layer of the kind used in performing the etching processes of the present invention.

One illustrative embodiment of the inventive process is used for etching a wafer 114 containing a film stack 310 of FIG. 3a. The film stack 310 comprises a layer of silicon 302 atop a substrate 304 and a patterned photoresist 306 residing atop the silicon layer 302. The photoresist 306 is patterned to leave a portion 308 of the silicon layer 302 exposed to the etch chemistry.

Figure 3B:
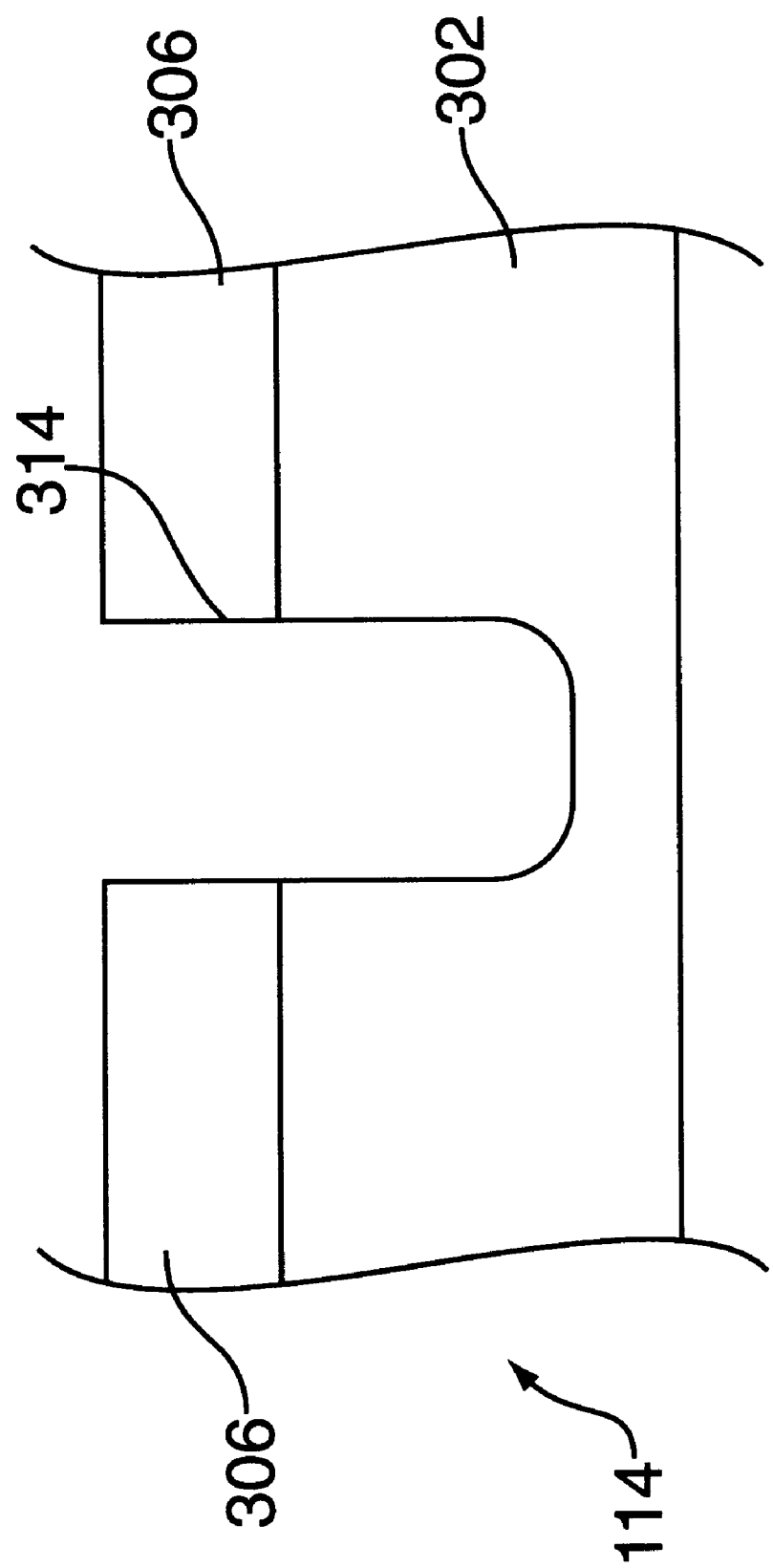
FIG. 3b depicts a schematic cross-sectional view of a trench profile etched in the substrate of FIG. 3a using a chlorine and sulfur dioxide etching chemistry of the present invention.

The result of the inventive etching method is best appreciated by referring to a trench profile depicted in FIG. 3b. The profile illustrates a wafer 114 having a silicon layer 302 and photoresist 306 etched using the $Cl_2$ chemistry mixed with $SO_2$ that provided a silicon etch rate of about 5000 A/min with a photoresist selectivity of 2.17. The good selectivity is apparent by the near vertical shape of the trench sidewall 314. It should also be noted that the selectivity will vary depending on the aspect ratio (defined generally as the ratio of depth:width) of the specific structure being etched. The selectivity of the present invention compares favorably over the prior art. The present invention has a selectivity of 2.17 contrasted against the selectivity of 0.95 for the $Cl_2$ only chemistry and 1.5 for the $Cl_2/O_2$ chemistry. Additionally, the etch rate of the present invention compares favorably with the etch rate of the prior art. The present invention has an etch rate of 5000 A/min contrasted against the etch rate of 2853 A/min the $Cl_2$ only chemistry and etch rate of 3852 A/min for the $Cl_2/O_2$.

To complete the trench, a photoresist stripping procedure (not shown) would normally follow the etch process. Such stripping procedures are well known by those who are skilled in the art.

Although the present invention is disclose illustratively using $Cl_2$, other gases containing chlorine, such as HCl, will advantageously etch silicon by utilizing the teachings described herein. Additionally, the invention may be practiced in other etching equipment wherein the processing parameters may be adjusted to achieve acceptable etch characteristics by those skilled in the arts by utilizing the teachings disclosed herein without departing from the spirit of the invention.

What is claimed is:

1. A method of plasma etching a layer of silicon comprising the steps of:

exposing said silicon layer to a plasma comprising a sulfur dioxide gas and chlorine containing gas.

2. The method of claim 1 wherein said chlorine containing gas is $Cl_2$.

3. The method of claim 2 wherein said exposing step further comprises the step of:

supplying 20 to 300 sccm of $Cl_2$ and 2 to 100 sccm of $SO_2$.

4. The method of claim 1 further comprising the step of:

maintaining a gas pressure of between 2–100 mTorr.

5. The method of claim 1 further comprising the step of:

maintaining a gas pressure of 40 mTorr.

6. The method of claim 1 further comprising the step of:

applying a bias power to a cathode electrode of 20 to 300 W.

7. The method of claim 1 further comprising the step of:

applying a bias power to a cathode electrode of 225 W.

8. The method of claim 1 further comprising the step of:

applying an inductive source power to an inductively coupled antenna of 200 to 2500 W.

9. The method of claim 1 further comprising the step of:

applying an inductive source power to an inductively coupled antenna of 1000 W.

10. The method of claim 1 further comprising the step of:

maintaining a workpiece containing said silicon layer at a temperature between minus 50 to plus 100 degrees Celsius.

11. The method of claim 1 further comprising the step of:

maintaining a workpiece containing said silicon layer at a temperature of 50 degrees Celsius.

12. A method for plasma etching a workpiece having a layer of silicon comprising the steps of:

supplying between 20 to 300 sccm of chlorine and between 2 to 100 sccm of sulfur dioxide;

maintaining a gas pressure of between 2–100 mTorr;

applying a bias power to a cathode electrode of between 10 to 300 W;

applying power to an inductively coupled antenna of between 200 to 2500 W to produce a plasma containing said chlorine gas and said sulfur dioxide gas;

maintaining said workpiece at a temperature between minus 50 and 100 degrees Celsius.

13. A computer-readable medium having stored thereon a plurality of instructions, the plurality of instructions including instructions which, when executed by a processor, cause a substrate processing chamber to perform the steps of:

supplying a gas mixture of a sulfur dioxide gas and a chlorine containing gas to a chamber having a wafer comprising a silicon layer; and igniting a plasma of said gas mixture to expose said silicon layer to said plasma.

14. The computer-readable medium of claim 13 wherein said chlorine containing gas is $Cl_2$.

15. The computer-readable medium of claim 14 wherein said supplying step further comprises the step of:

supplying between 20 to 300 sccm of $Cl_2$ and between 2 to 100 sccm of $SO_2$.

16. The computer-readable medium of claim 13 further comprising the step of:

maintaining a gas pressure of between 2–100 mTorr.

17. The computer-readable medium of claim 13 further comprising the step of:

maintaining a gas pressure at 40 mTorr.

18. The computer-readable medium of claim 13 further comprising the step of:

applying a bias power to a cathode electrode of between 20 to 300 W.

19. The computer-readable medium of claim 13 further comprising the step of:

applying a bias power to a cathode electrode of 225 W.

20. The computer-readable medium of claim 13 wherein said ignition step comprises the step of:

applying power to an inductively coupled antenna of between 200 to 2500 W.

21. The computer-readable medium of claim 13 wherein said ignition step comprises the step of:

applying power to an inductively coupled antenna of 1000 W.

22. The computer-readable medium of claim 13 further comprising the step of:

maintaining said wafer at a temperature between minus 50 and 100 degrees Celsius.

23. The computer-readable medium of claim 13 further comprising the step of:

maintaining said wafer at a temperature of 50 degrees Celsius.

* * * * *

UNITED STATES PATENT AND TRADEMARK OFFICE
CERTIFICATE OF CORRECTION

PATENT NO. : 6,415,198 B1 Page 1 of 1
DATED : July 2, 2002
INVENTOR(S) : Padmapani C. Nallan, Ajay Kumar and Jeffrey D. Chinn It is certified that error appears in the above-identified patent and that said Letters Patent is hereby corrected as shown below:

Column 1,
Line 37, please change "A/min" to -- Å/min --.

Column 4,
Line 15, please change "SO2" to -- $SO_2$ --.
Line 43, please change "A/min" to -- Å/min --.
Line 54, please change "A/min" to -- Å/min --.
Line 55, please change "A/min" to -- Å/min --.

Signed and Sealed this

Third Day of December, 2002

JAMES E. ROGAN
*Director of the United States Patent and Trademark Office*